US012695447B2

(12) United States Patent
Baeurle et al.

(10) Patent No.: US 12,695,447 B2
(45) Date of Patent: Jul. 28, 2026

(54) FAULT PROTECTION IN SWITCH DRIVER UNITS

(71) Applicant: POWER INTEGRATIONS, INC., San Jose, CA (US)

(72) Inventors: Stefan Baeurle, San Jose, CA (US); Michael Yue Zhang, Mountain View, CA (US); Andreas Volke, Soest (DE); Christoph Dustert, Soest (DE); Karsten Fink, Werl (DE); Michael Hornkamp, Ense (DE)

(73) Assignee: POWER INTEGRATIONS, INC., San Jose, CA (US)

( * ) Notice: Subject to any disclaimer, the term of this patent is extended or adjusted under 35 U.S.C. 154(b) by 0 days.

(21) Appl. No.: 18/836,267

(22) PCT Filed: Jan. 17, 2023

(86) PCT No.: PCT/US2023/060728
§ 371 (c)(1),
(2) Date: Aug. 6, 2024

(87) PCT Pub. No.: WO2023/158894
PCT Pub. Date: Aug. 24, 2023

(65) Prior Publication Data
US 2025/0047274 A1 Feb. 6, 2025

Related U.S. Application Data

(63) Continuation-in-part of application No. 17/845,117, filed on Jun. 21, 2022, now Pat. No. 11,907,054.
(Continued)

(30) Foreign Application Priority Data

Apr. 1, 2022 (EP) ..................................... 22166294

(51) Int. Cl.
H03K 17/0812 (2006.01)
H03K 17/082 (2006.01)
H03K 17/18 (2006.01)

(52) U.S. Cl.
CPC ....... *H03K 17/0812* (2013.01); *H03K 17/082* (2013.01); *H03K 17/18* (2013.01)

(58) Field of Classification Search
CPC ... H03K 17/0812; H03K 17/082; H03K 17/18
See application file for complete search history.

(56) References Cited

U.S. PATENT DOCUMENTS 10,008,942 B1    6/2018   Horwitz et al.
10,181,813 B2    1/2019   Baurle et al.
(Continued)

OTHER PUBLICATIONS

European Patent Application No. 22166294.3, Extended European Search Report mailed Aug. 23, 2022, 9 pages.
(Continued)

*Primary Examiner* — Sibin Chen
*Assistant Examiner* — James G Yeaman

(57) ABSTRACT

A device comprising a plurality of switches and a plurality of driver units. Each driver unit is coupled to drive a respective switch of the plurality of switches. A system controller is coupled to each of the driver units by a bus, wherein the system controller is configured to coordinate driving of the respective switches by the driver units. The device further comprises at least one communication channel coupled to each of the driver units, wherein the driver units are configured to communicate with each other over the communication channel without mediation by the system controller.

8 Claims, 11 Drawing Sheets

Related U.S. Application Data

(60) Provisional application No. 63/311,273, filed on Feb. 17, 2022.

(56) References Cited

U.S. PATENT DOCUMENTS

| | | | | |
|---|---|---|---|---|
| 10,886,870 | B2 | 1/2021 | Baurle et al. | |
| 10,998,843 | B2 | 5/2021 | Baeurle | |
| 11,050,361 | B2 * | 6/2021 | Hiya | H02M 1/088 |
| 2004/0136135 | A1 | 7/2004 | Takahashi | |
| 2014/0265979 | A1 | 9/2014 | Xu et al. | |
| 2016/0248242 | A1 | 8/2016 | Petruzzi et al. | |
| 2017/0134018 | A1 | 5/2017 | Imanishi et al. | |
| 2018/0123495 | A1 | 5/2018 | Bäurle et al. | |
| 2018/0302017 | A1 | 10/2018 | Baurle et al. | |
| 2019/0326897 | A1 * | 10/2019 | Murakami | H03K 17/127 |
| 2021/0067081 | A1 | 3/2021 | Nakazima et al. | |

OTHER PUBLICATIONS

PCT Application No. PCT/US2023/060728; International Report on Patentability; Aug. 29, 2023; 13 pages.
PCT Application No. PCT/US2023/060728; International Search Report and Written Opinion of the International Searching Authority; May 9, 2023; 16 pages.
U.S. Appl. No. 17/845,117, Non-Final Office Action mailed May 24, 2023; 12 pages.

* cited by examiner

CHANGE IN HALF-BRIDGE
OUTPUT HB IS INHIBITED WHEN
ERROR SIGNAL IS HIGH

FAULT PROTECTION IN SWITCH DRIVER UNITS

This application is a National Stage of International Application No. PCT/US2023/060728, filed on Jan. 17, 2023, now pending, which claims the benefit of U.S. Provisional Application No. 63/311,273, filed Feb. 17, 2022. International Application No. PCT/US2023/060728, and U.S. Provisional Application No. 63/311,273 are incorporated by reference in their entirety.

This application is a National Stage of International Application No. PCT/US2023/060728, filed on Jan. 17, 2023, now pending, which claims priority under Article 8 of the Patent Cooperation Treaty (PCT) to U.S. application Ser. No. 17/845,117 filed on Jun. 21, 2022 and issued as U.S. Pat. No. 11,907,054 on Feb. 20, 2024, which claims the benefit of U.S. Provisional Application No. 63/311,273, filed Feb. 17, 2022. International Application No. PCT/US2023/060728, U.S. application Ser. No. 17/845,117 and U.S. Provisional Application No. 63/311,273 are incorporated by reference in their entirety.

This application is a National Stage of International Application No. PCT/US2023/060728, filed on Jan. 17, 2023, now pending, which claims priority under Article 8 of the PCT to European Patent Application No. EP22166294.3, filed on Apr. 1, 2022, now pending. International Application No. PCT/US2023/060728 and European Patent Application No. EP22166294.3 are incorporated by reference in their entirety.

BACKGROUND

Field of the Invention

The present invention relates generally to systems of multiple electronic switching modules that use a single-wire bus between the switching modules for fault condition management. More specifically, it relates to half-bridge inverter modules that may be used in such systems for multi-phase brushless dc (BLDC) or synchronous permanent magnet motor drives.

Household and industrial appliances such as ventilation fans, cooling systems, refrigerators, dishwashers, washer/dryer machines, and many other large household products/goods use electric motors that transfer energy from an electrical source to a mechanical load. Electrical energy for driving the electric motors is provided through a drive system, which draws electrical energy from an electrical source (e.g., from an ac low frequency source). The electrical energy received from the electrical source is first processed through a power converter, and then converted to a desired form of electrical energy (typically a dc voltage) that is supplied to the motor through a system of drivers that typically includes two or more dc-ac inverters. The inverters are operated by a system controller to achieve the desired mechanical output. The desired mechanical output of the motor may be a mechanical operating parameter, e.g. the speed of the motor, the torque, or the position of a motor shaft.

Motors and their related circuitries such as motor drives represent a large portion of utility network loads. The functionality, efficiency, size, and price of motor drives are challenging and competitive factors that suppliers of these products consider. The motor drive system provides the input electrical signals to the motor such as voltage, current, frequency, and phase for a desired mechanical output. A motor drive system typically includes multiple driver modules. A driver module in one example may include an inverter that receives a dc input to produce an ac output of desired voltage, current, frequency, and phase. A system controller is typically a digital processor (sometimes referred to as a microcontroller unit or MCU) that receives low-power signals from the driver modules or from dedicated external sensors to produce the desired mechanical output. The system controller may compare the sensed values to the desired values and may adjust the operation of the drivers to maintain the target output of the motor. The system controller may also receive information from the driver modules via a digital communication bus that provides status information about the drivers or other information useful for management of the system.

An important consideration for any system that controls a motor is the safety of users in the event of a fault condition. Such systems generally must undergo rigorous testing by regulatory agencies before they are certified for sale. Systems that rely on the MCU system controller to manage fault conditions typically must repeat the safety certification testing whenever there is any change to the programming of the MCU, even if the change is unrelated to the handling of a fault condition. It is desirable for systems to have the ability to respond safely to fault conditions independently of the system controller.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
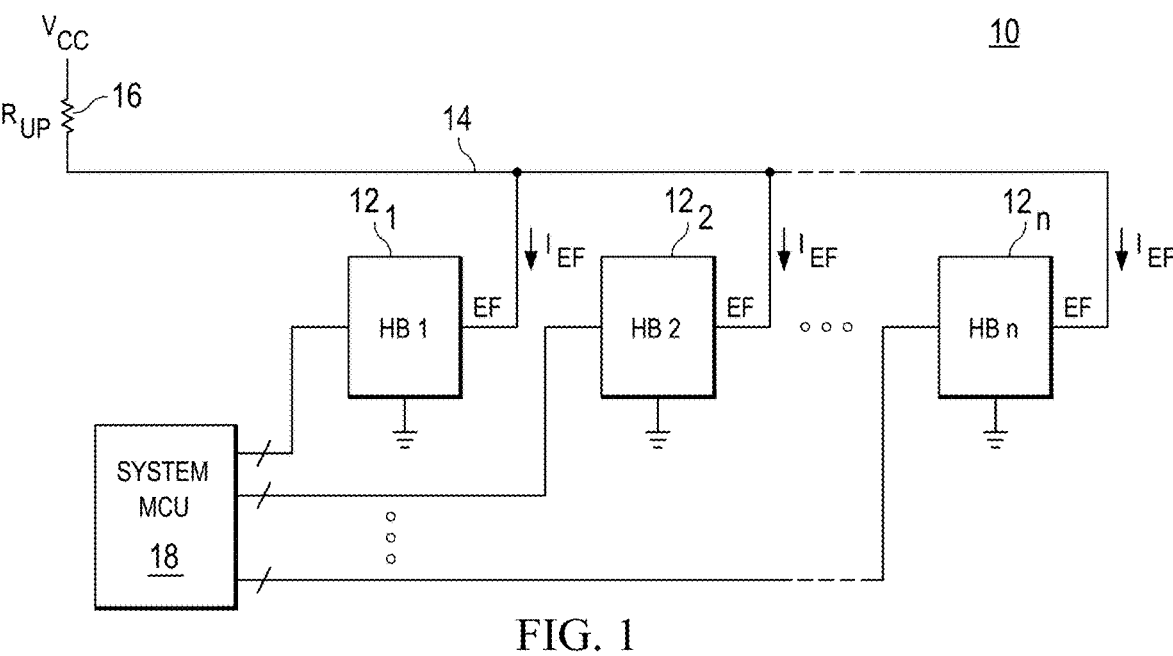
FIG. 1 illustrates an embodiment of the system 10. For a plurality of driver modules $12_n$, each driver module is coupled to ground and has an Error Flag (EF) output.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

In the context of the present application, when a transistor is in an "off state", or "off", the transistor does not substantially conduct current. Conversely, when a transistor is in an "on state", or "on", the transistor is able to substantially conduct current. By way of example, in one embodiment, a high-voltage transistor comprises an N-channel metal-oxide-semiconductor (NMOS) field-effect transistor (FET) with the high-voltage being supported between the first terminal, a drain, and the second terminal, a source. The high voltage metal-oxide-semiconductor field-effect transistor (MOSFET) may comprise a power switch that is driven by an integrated controller circuit to regulate energy provided to a load. In another embodiment, the high voltage transistor comprises a normally on GaN device in series with a normally off, low-voltage metal-oxide-semiconductor (MOS) FET. For purposes of this disclosure, "ground" or "ground potential" refers to a reference voltage or potential against which all other voltages or potentials of an electronic circuit or an integrated circuit (IC) are defined or measured.

Half-bridge inverter modules are typically coupled to drive a motor, e.g. single phase motor or a 3-phase motor, in response to a system controller. The power switching block of each half-bridge inverter module may include a high side switch coupled to a low side switch, with a mid-point terminal between the high side switch and the low side switch coupled to a respective terminal of the motor.

The system comprises a plurality of driver modules connected by a fault condition bus, e.g. a single-wire bus.

Each driver module includes a Control block and an Error Flag Interface block. The Control block may include a multitude of conventional and known electronic circuits that perform specialized tasks essential to the desired operation of the driver module. For example, the Control block may include reference circuits to generate and maintain reference voltages and reference currents, sensing circuits to sense voltages on terminals and currents in transistor switches, comparator circuits to detect when parameters are above or below limits, thermal circuits to determine the temperature of components on the module, logic circuits to determine if a local fault occurs in the module, digital communication circuits to communicate with a system microcontroller, error detection circuits to receive error signals in response to signals transmitted from external modules, test circuits to determine proper operation of subcircuits on the module, driver circuits to operate output transistors, and shutdown circuits to prevent the output of the module from switching. The Error Flag Interface block has a single terminal Error Flag Input/Output (EF I/O) that connects to the single-wire bus. The driver module may have an inverter output HB connected to a motor.

Error detection circuits in the Control block are configured to detect a local fault condition, and logic circuits in the Control block are configured to generate an ERROR_LOCAL signal when the driver module detects a local fault condition. A local fault condition, as distinguished from an external fault condition, is one detected by the driver module. When the Error Flag Interface block receives the ERROR_LOCAL signal, the single terminal error flag I/O is configured to change the state of the single-wire bus from a first logic state (indicating no error) to a second logic state (indicating an error).

The Error Flag Interface block is further configured to receive an external error flag signal from the single-wire bus. The external flag signal indicates an external fault condition, e.g. one that is detected outside the driver module. When the external flag signal is in a second logic state, an external fault condition has been detected. When the external flag signal is in a first logic state, the external fault condition has been removed indicating that the receiving driver module may be reset.

For each driver module, when the single terminal error flag I/O receives the external error flag signal in a second logic state, the Error Flag Interface block locally transmits an ERROR signal to the Control block to trigger shutdown circuits in the Control block that cause the driver module to stop switching its inverter output HB. When the state of the external error flag signal changes from a second logic state to a first logic state, the Error Flag Interface block locally transmits a switch signal to trigger logic circuits in the Control block of the driver module to resume normal operation. Alternately, the Error Flag Interface block may locally transmit the switch signal to trigger the motor to begin normal operation when a user defined condition has been met.

The local fault conditions are selected from a group that includes over-current, over-voltage, and over-temperature.

The driver module may be a half-bridge inverter integrated circuit in a 3-phase motor drive configuration, a half-bridge inverter integrated circuit in an H-bridge configuration for a single-phase motor drive, or an assembly of multiple components that includes a smart device (e.g. driver and power switch) in a single package. The system may include multiple motors that use multiple driver modules.

FIG. 1 illustrates an embodiment of the system 10. For a plurality of half-bridge inverters $12_n$, each half-bridge inverter is coupled to ground and has a single terminal Error Flag Input/Output flag EF I/O. Each single terminal EF I/O is electrically coupled to a fault condition bus, e.g. single-wire bus 14. A pull-up resistor $R_{UP}$ 16 is electrically coupled to system voltage $V_{CC}$ and the single-wire bus 14. A System MCU 18 is electrically coupled to each of the plurality of half-bridge inverters $12_n$.

In operation, for each half-bridge inverter, the state of the single terminal EF I/O enables simple inter-module communication in the event that one of the half-bridge inverters $12_n$ detects a local fault condition. This local fault condition usually requires the half-bridge inverter $12_n$ to stop switching its output.

The system 10 uses an open drain architecture with a controlled pull-down capability using a current sink and requires a pull-up resistor $R_{UP}$ coupled to system $V_{CC}$. The voltage on the single-wire bus falls when current removed from the single-wire bus exceeds the current that the voltage $V_{CC}$ can provide through the pull-up resistor $R_{UP}$.

In one embodiment, when the half-bridge inverter detects a local fault condition, e.g. over-temperature, over-voltage, or over-current, it inhibits switching by pulling the single terminal EF I/O to a logic low state level VEFL, thereby lowering the voltage on the single-wire bus 14 and setting the state on all of the single terminal EF I/Os in the system to VEFL. In response, the half-bridge inverters will stop switching. In one embodiment, the half-bridge inverter sets an internal fault latch to make the inhibited switching permanent until the single terminal EF I/O is reset. The internal fault latch may be set by fault conditions that include a Low Side (LS) MOSFET over-temperature protection latching shutdown, line over-voltage, and a LS MOSFET sustained over-current protection latching shutdown.

The local fault conditions may be defined by the user. By way of illustration, these conditions may include a selection between either hysteretic or latching shutdown protection modes for conditions of over-current and over-temperature.

In one embodiment, resetting the single terminal EF I/O occurs when either the local fault condition has cleared or is below a predetermined threshold. As a result, the affected half-bridge inverter releases the single terminal EF I/O (stops pulling current from the single-wire bus) which raises the voltage on the single-wire bus 14, thereby changing the state on each single terminal EF I/O in the system to VEHL. In response, the half-bridge inverter will resume normal operation and reset its internal fault latch.

In another embodiment, resetting the single terminal EF I/O occurs when the half-bridge inverter receives an external signal to reset. To reset the single terminal EF I/O, an external source may pull the single terminal EF I/O to a logic high state level VEFH. A rising edge at the single terminal EF I/O raising the voltage above the logic high state level VEFH resets the internal fault latch (not shown) for each half-bridge inverter connected to the single-wire bus 14.

Figure 2:
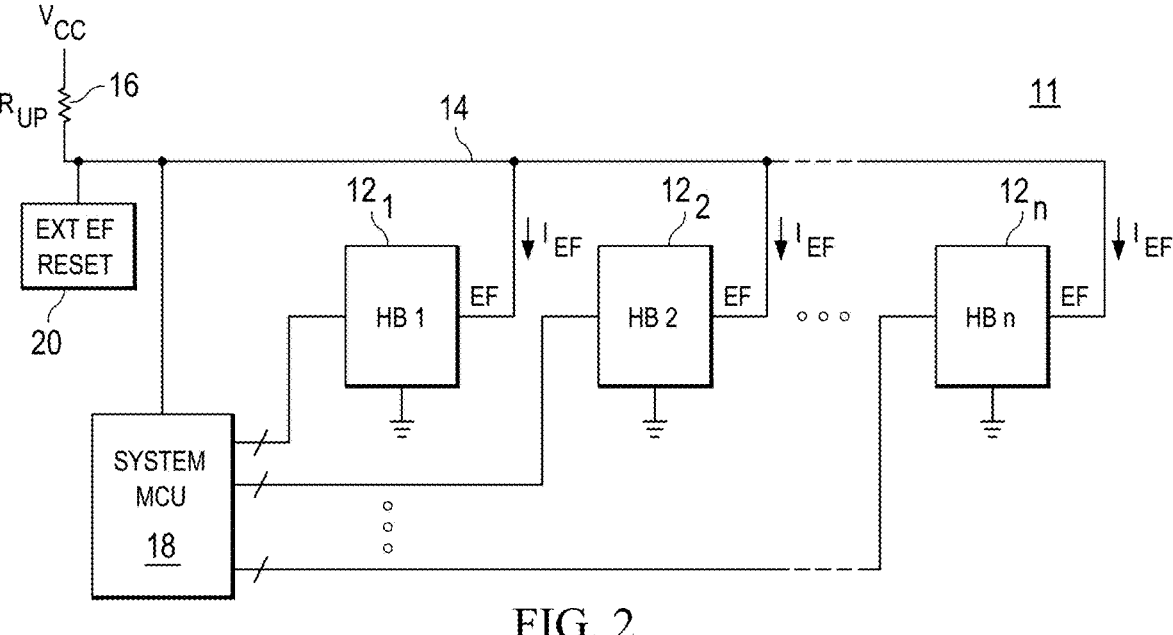
FIG. 2 illustrates another embodiment of the system 10 that includes an external error flag reset.

FIG. 2 illustrates another embodiment of the system 11. For a plurality of half-bridge inverters $12_n$, each half-bridge inverter is coupled to ground and has a single terminal EF I/O. Each single terminal EF I/O is electrically coupled to a single-wire bus 14. A pull-up resistor $R_{UP}$ 16 is electrically coupled to system $V_{CC}$ and the single-wire bus 14. A System MCU 18 is electrically coupled to each of the plurality of half-bridge inverters $12_n$ and to the EXT EF Reset circuit 20, which is coupled to the single-wire bus 14. The system 10 may be reset externally through the EXT EF RESET circuit 20 or via the System MCU 18.

Applying a reset signal, EXT EF Reset circuit 20 injects a current $I_{RES}$ greater than the maximum single terminal EF I/O pull-down current $I_{EF}(MAX)$ and forces the single terminal EF I/O of each of the half-bridge inverters to go high, which in turn resets their respective internal latches.

In another embodiment, the System MCU 18 sends a latch reset command some time after the affected half-bridge inverter has pulled its respective single terminal EF I/O to logic low. For each half-bridge inverter, the single terminal EF I/O is forced to logic HIGH, which in turn resets its respective internal latch.

Figure 3:
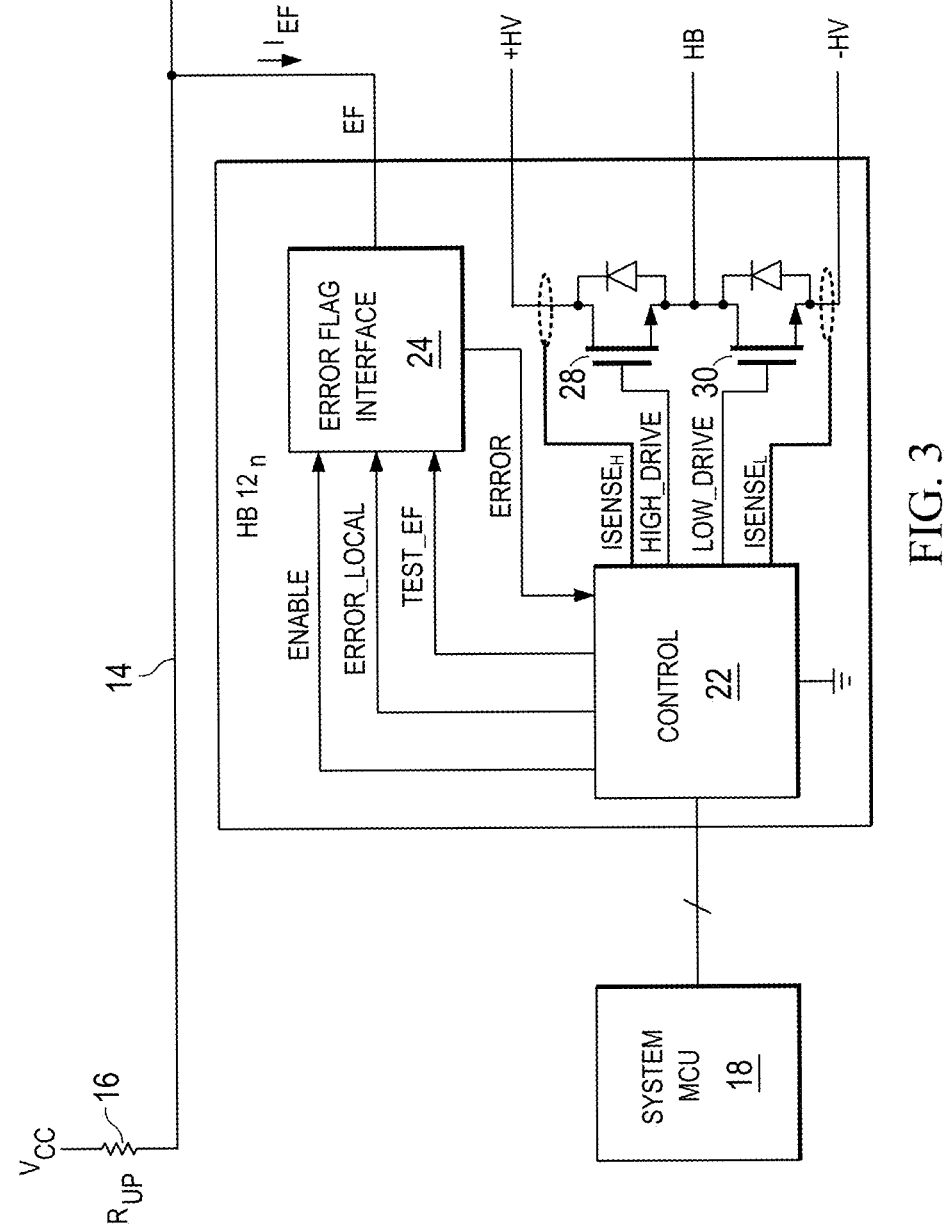
FIG. 3 is a functional block diagram for a driver module, e.g. half-bridge inverter $12_n$, configured according to FIG. 1.

FIG. 3 is a block diagram for a half-bridge inverter $12_n$ configured according to FIG. 1. The half-bridge inverter $12_n$ includes an Error Flag Interface block 24 having a single terminal EF I/O connected to circuits in a Control block 22. The circuits in Control block 22 are further connected to driving circuits that provide an inverter output signal HB. The driving circuits drive two switches 28, 30 sharing a common node at the output of the half-bridge inverter. The switches are electrically connected between a high voltage source +HV and a low voltage source −HV. Current monitor circuits in Control block 22 measure the currents in the switches coupled between the high voltage source +HV and the low voltage source −HV from the respective current sense signals $ISENSE_H$ and $ISENSE_L$. The inverter output HB for the half-bridge driver is at the midpoint between the two switches 28, 30. The Error Flag Interface block may be enabled when logic circuits in the Control block 22 send the ENABLE signal to the Error Flag Interface block 24.

The half-bridge inverter may be part of a 3-phase motor drive or part of a single phase motor drive in an H-bridge configuration. Many half-bridge inverters that drive many different motors in a system may share the single-wire bus.

When a local fault condition is detected or when the EF detection feature is tested by assertion of a TEST_EF signal, logic circuits in the Control block 22 send an ERROR_LOCAL signal to the Error Flag Interface block 24. The Error Flag Interface block 24 pulls the single terminal EF I/O to a logic low VEFL.

For an external fault condition, when the Error Flag Interface block 24 detects that the single terminal EF I/O is at a logic low VEFL, an ERROR signal is sent to logic circuits in the Control block 22 to disable the switching of the driving circuit. In one embodiment, the assertion of the ERROR signal may configure logic circuits in the Control block 22 to ignore signals from the System MCU.

Figure 4:
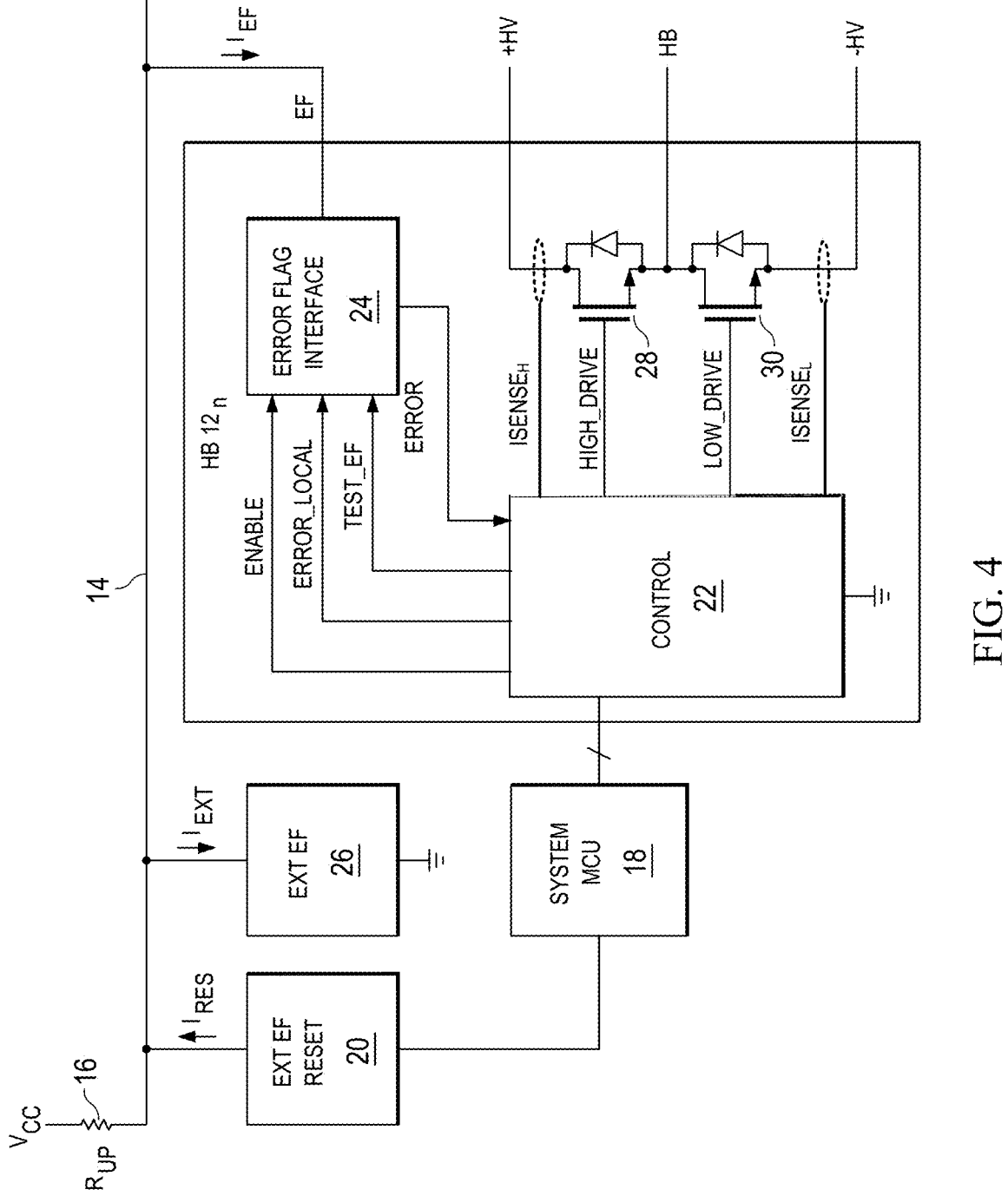
FIG. 4 is a functional block diagram for the half-bridge inverter $12_n$ configured according to FIG. 2.

FIG. 4 is a functional block diagram for the half-bridge inverter $12_n$ configured according to FIG. 2. The EXT EF RESET block 20 and EXT EF block 26 are electrically coupled to the single terminal EF I/O of the half-bridge inverter $12_n$.

In operation, when the EXT EF RESET block 20 injects a current $I_{RES}$ greater than the maximum single terminal EF I/O pull-down current $I_{EF}(MAX)$. The single terminal EF I/O of each of the half-bridge inverters then goes high, which in turn resets their respective internal latches.

In operation, when the EXT EF block 26 lowers the voltage of the single-wire bus to a logic level low VEFL, the single terminal EF I/O of each of the half-bridge inverters goes low, which in turn disables their respective driving circuits.

Figure 5:
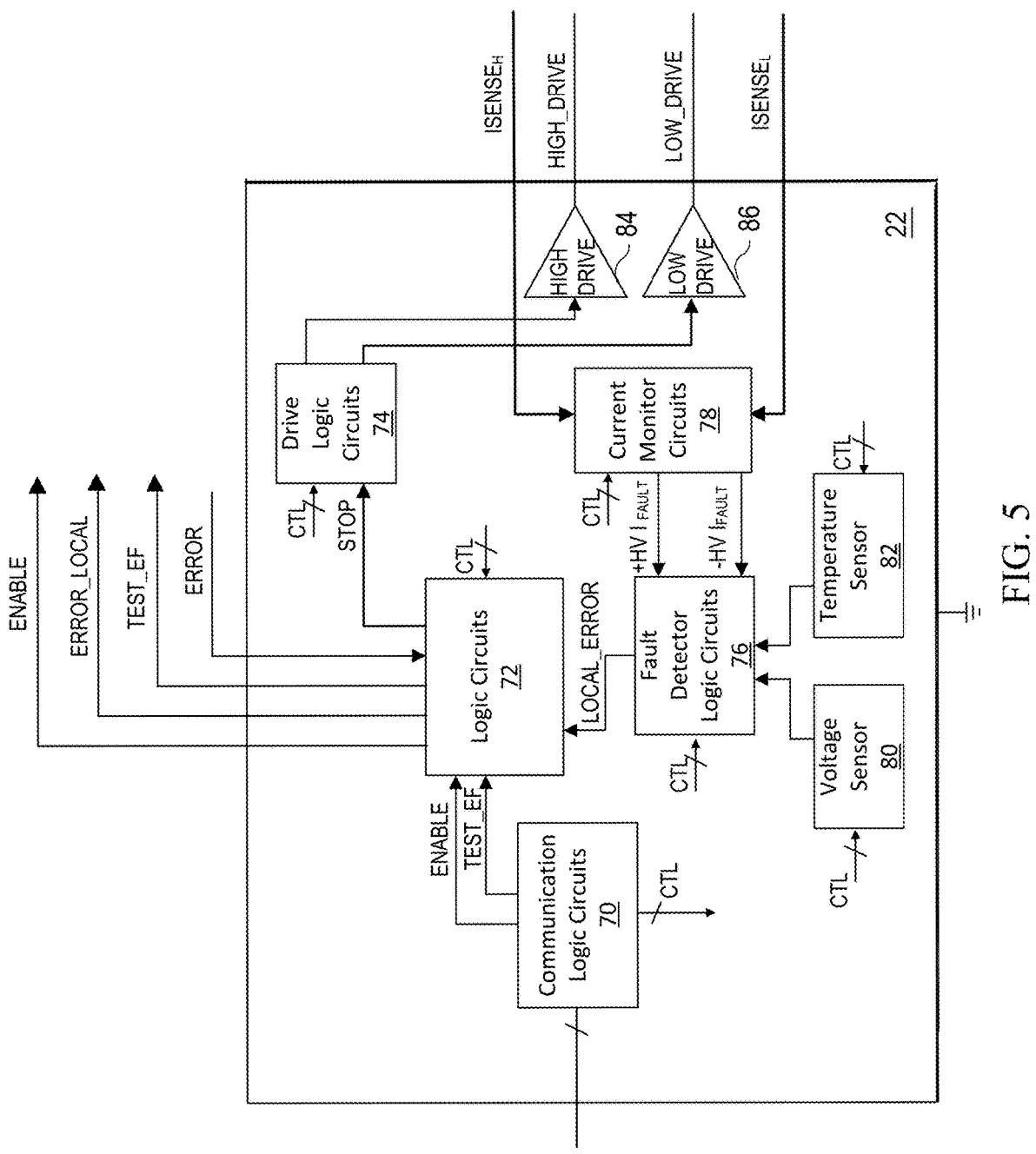
FIG. 5 is a block diagram for the control block 22 configured according to FIG. 3.

FIG. 5 is an example block diagram for the control block 22 configured according to FIG. 3. In the example of FIG. 5, the Communication Logic Circuits 70 are connected to System MCU 18 (shown in FIG. 2) and provide the outputs ENABLE and TEST_EF to the Logic Circuits 72. The Drive Logic Circuits 74 are connected between the Logic Circuits 72 and the driver circuits 84, 86. The High Drive Circuit 84 provides the High_Drive signal while the Low Drive Circuit 86 provides the Low_Drive signal.

The Fault Detector Logic Circuits connect between Logic Circuits 72 and the sensors 80, 82. The Voltage Sensor 80 may provide an output indicative of an over-voltage or an under-voltage fault condition for voltages that may be internal or external to the module, depending how the module is configured in the motor drive system. The Temperature Sensor 82 provides an output indicative of an over-temperature fault condition. The Current Monitor Circuits 78 connect between the Fault Detector Logic Circuits 76 and the current sensing signals ISENSE$_H$ and ISENSE$_L$. The Current Monitor Circuits 78 provide outputs, +HV I$_{FAULT}$ and −HV$_{IFAULT}$. +HV I$_{FAULT}$ indicates an over-current fault condition related to current taken from the high voltage source +HV. −HV I$_{FAULT}$ indicates an over-current fault condition related current delivered to the low voltage source −HV.

The Fault Detector Logic Circuits 76 provide an output LOCAL_ERROR indicative of the local fault conditions to the Logic Circuits 72. The Logic Circuits 72 provide the outputs ENABLE, ERROR_LOCAL, TEST_EF to the Error Flag Interface 24 (shown in FIG. 3).

The Error Flag Interface block provides an input ERROR signal to the Logic Circuits 72. An asserted ERROR signal indicates an external fault condition. The Logic Circuits 72 further provide an output STOP signal to the Drive Logic Circuits 74 which will provide signals to the drive circuits 84, 86 to stop the switching of the inverter output.

Figure 6:
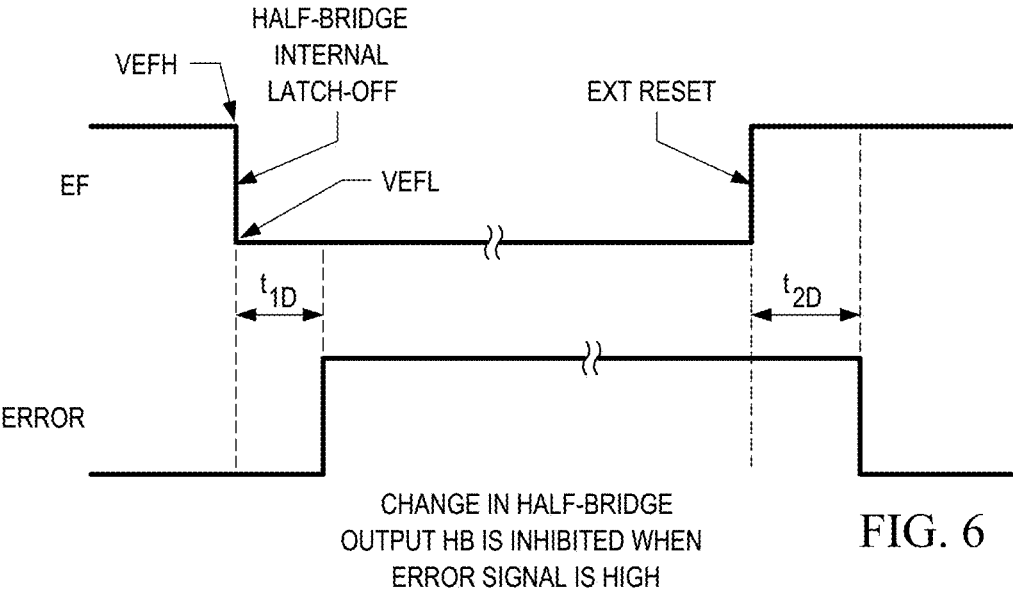
FIG. 6 is an Error Flag timing diagram that illustrates the delay times $t_{1D}$ and $t_{2D}$ (typically 10 μs) acting as a deglitch function.

FIG. 6 is an Error Flag timing diagram illustrating the delay times t$_{1D}$ and t$_{2D}$ (for example 10 μs) that may provide a deglitch function for the response to an external ERROR. The deglitch function may avoid false alarms that might otherwise result from noise on the single-wire bus. Any intervention of the System MCU 18 for the Error Flag function is not required as illustrated in the embodiment of FIG. 1. However, it may optionally connect to the Error Flag terminal for monitoring purposes or to reset the latches as in the embodiment of FIG. 2.

Initially, the single terminal EF I/O is at a logic high state VEFH. In response to detecting that the single terminal EF I/O has changed to a logic low state VEFL (indicative of an external error), the Error Flag Interface block asserts an ERROR signal that disables its respective driving circuit. When the single terminal EF I/O changes to a logic high state VEFH, the affected half-bridge inverter de-asserts the ERROR signal allowing its respective driving circuit to resume operation.

Figure 7:
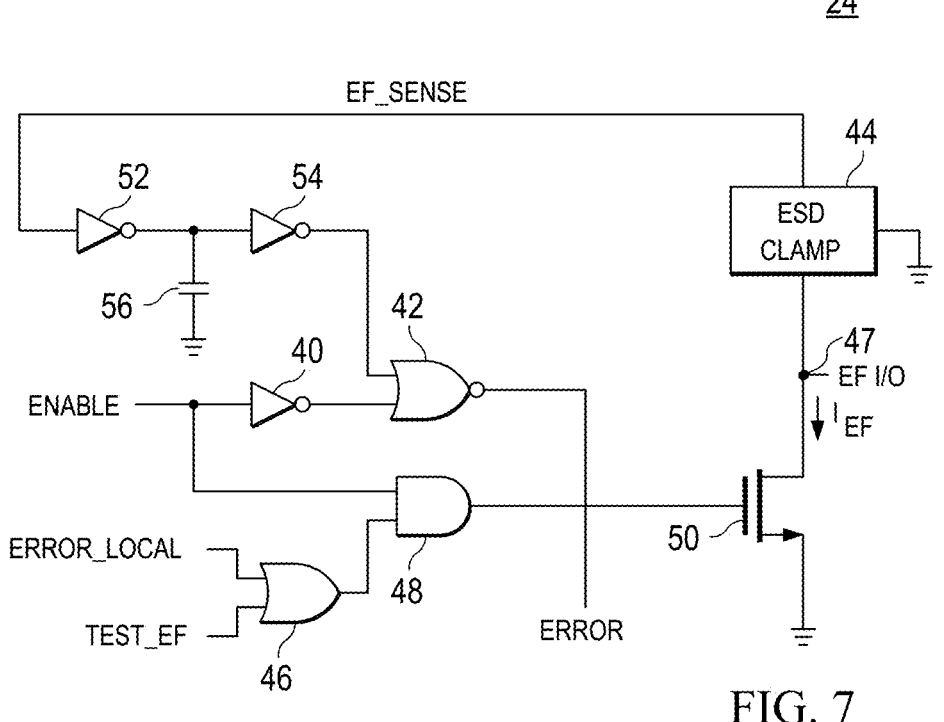
FIG. 7 is a logic diagram corresponding to the Error Flag Interface block 24 that is included in each half-bridge inverter $12_n$.

FIG. 7 is logic diagram corresponding to the Error Flag Interface block 24 that is included in each half-bridge inverter 12$_n$.

TEST_EF and ERROR_LOCAL signals are inputs to OR gate 46. The output of OR gate 46 and the ENABLE signal are inputs to AND gate 48. The drain of transistor 50 is connected to the single terminal EF I/O 47. The output of the AND gate 48 is connected to the gate of transistor 50. The source of transistor 50 is connected to ground.

An optional ESD Clamp circuit 44, connected between the single terminal EF I/O 47 and ground, delivers an EF_SENSE signal that is indicative of the voltage state on the single terminal EF I/O 47. ESD Clamp circuit 44 limits the magnitude of the EF_SENSE signal to protect the logic circuits from damage from excessive voltage that may appear on the single-wire bus. A first delay inverter 52 and a second delay inverter 54 are electrically in cascade. A capacitance 56 is connected at the midpoint between the first and second delay inverters 52, 54 and ground. The EF_SENSE signal is an input to the first delay inverter 52. The output of the second delay inverter 54 is a delayed EF_SENSE signal.

The ENABLE signal is received by an inverter 40. The delayed EF_SENSE signal and the inverted ENABLE signal are inputs to a NOR gate 42. The output of the NOR gate 42 is an ERROR signal that is indicative of an external fault condition.

Figure 8:
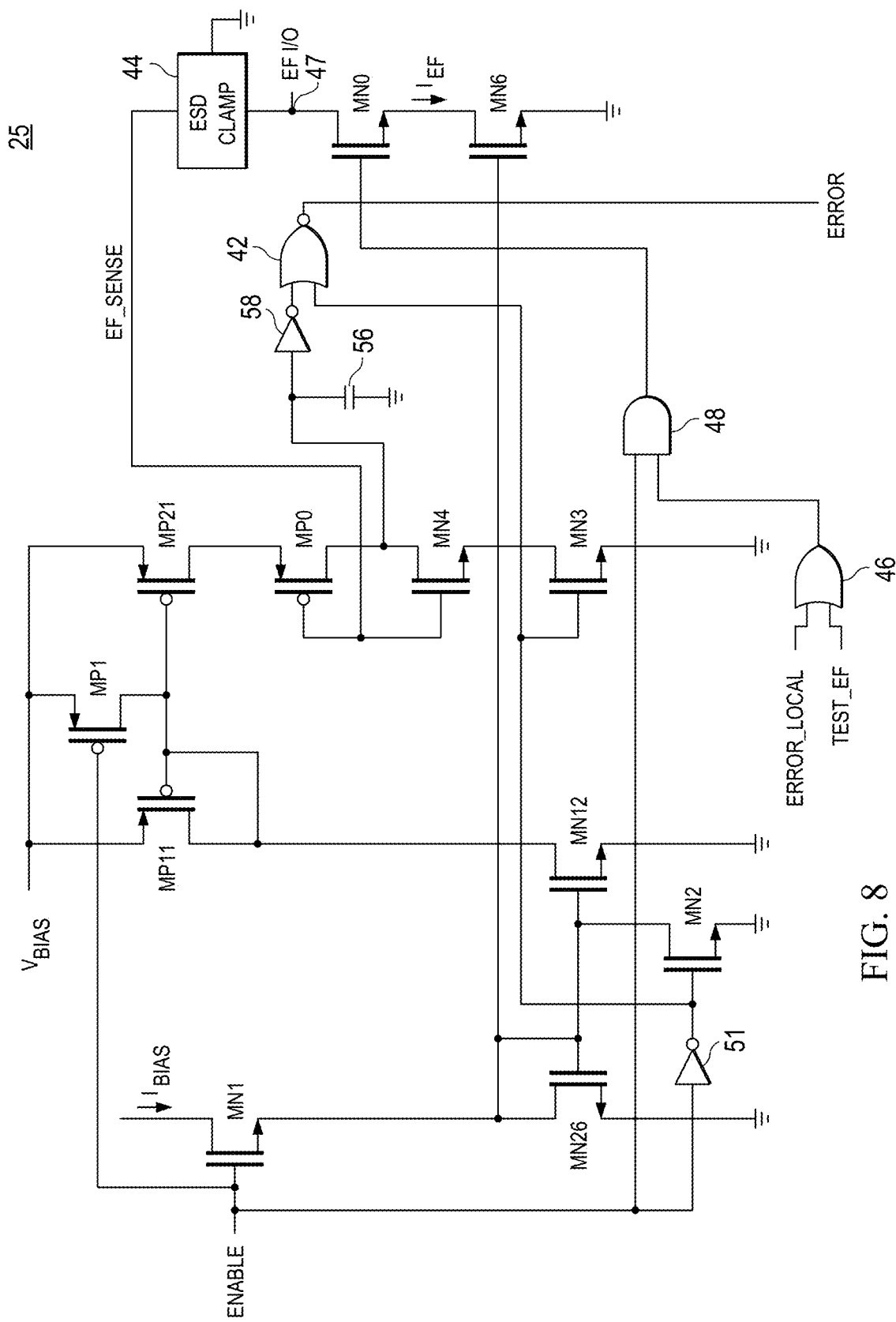
FIG. 8 is an embodiment of a circuit implementation of the Error Flag Interface block 25 shown in FIG. 7.

FIG. 8 is an embodiment of a circuit implementation of the Error Flag Interface block 25 shown in FIG. 7.

nFET MN1 has a drain receiving a bias current I$_{BIAS}$, a gate receiving an ENABLE signal, and a source. nFET MN26 has a drain and a gate connected to the source of nFET MN1, and a source connected to ground.

pFET MP11 has a source connected to a bias voltage VBIAS. The gate and drain of pFET MP11 are electrically connected. nFET MN12 has a drain connected to the gate and drain of pFET MP11, a gate connected to the gate of nFET MN26, and a source connected to ground. nFET MN2 has a drain connected to the gate of nFET MN12, a gate connected to an output of an inverter 51, and a source connected to ground.

pFET MP1 has a source connected to the bias voltage V$_{BIAS}$, a gate receiving the ENABLE signal, and a drain connected the gate and drain of pFET MP11.

pFET MP21 has a source connected to the bias voltage V$_{BIAS}$, a gate connected to the gate and drain of pFET MP11, and a drain. pFET MP0 has a source connected to the drain of pFET MP21, a gate receiving the EF_SENSE signal, and a drain. nFET MN4 has a drain connected to the drain of pFET MP0, a gate receiving the EF_SENSE signal, and a source. nFET MN3 has drain connected to the source of nFET MN4, a gate connected to the gate of MN2, and a source connected to ground.

An OR gate 46 receives the ERROR_LOCAL signal and the TEST_EF signal. An AND gate 48 receives the output of the OR gate 46 and the ENABLE signal.

The drain of nFET MN4 is an input to the inverter 58. The capacitance 56 connects between the input of inverter 58 and ground. The output of inverter 58 is a delayed EF_SENSE signal. The delayed EF_SENSE signal and the inverted ENABLE signal are inputs to a NOR gate 42. The output of the NOR gate 42 is an ERROR signal that is indicative of an external fault condition.

An optional ESD Clamp circuit 44, connected between the single terminal EF I/O, ground, and the gate of MP0, delivers an EF_SENSE signal that is indicative of the voltage state on the single terminal EF I/O. ESD Clamp circuit 44 limits the magnitude of the EF_SENSE signal to protect the logic circuits from damage from excessive voltage that may appear on the single-wire bus.

nFET MN0 has a drain connected to the single terminal EF I/O, a gate connected to the output of AND gate 48, and source. nFET MN6 has a drain connected to the source of nFET MN0, a gate connected to the source of nFET MN1, and a source connected ground.

In operation, the single terminal EF I/O is an open drain directly connected to the single-wire bus 14. When a local error is detected by error detection circuits in Control block 22, the ERROR_LOCAL signal will be high, thereby turning on transistor nFET MN0 and pulling the single terminal EF I/O to a logic low state level VEFL with a current I$_{EF}$ that is proportional to current I$_{BIAS}$.

The EF_SENSE signal is high during normal operation and is low when a signal indicating an external fault condition, e.g. external device EF control or control from System MCU 18 is detected. When the EF_SENSE signal is low, the ERROR signal is asserted to cause the inverter to stop switching its output. When the EF_SENSE signal is high, the ERROR signal is de-asserted to cause the inverter to resume switching its output.

Figure 9:
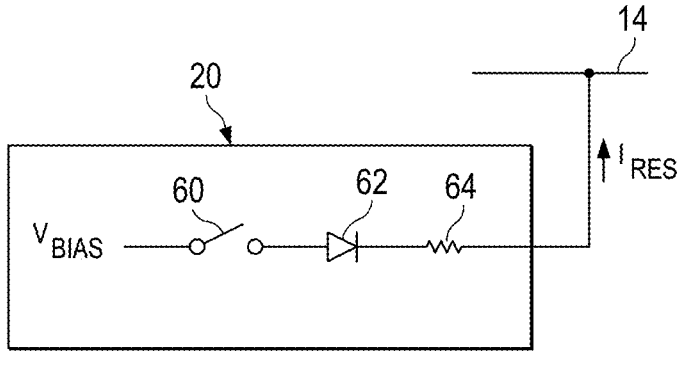
FIG. 9 is a circuit diagram corresponding to the EXT EF RESET block 20 shown in FIG. 2.

FIG. 9 is a circuit diagram corresponding to the EXT EF Reset block 20 shown in FIG. 2. A switch 60 receives the bias voltage $V_{BIAS}$. The anode of diode 62 receives the output of the switch 60. A resistor 64 connects between the cathode of the diode 62 and the single-wire bus 14. In operation, closing switch 60 injects a current $I_{RES}$ into the single-wire bus 14. The current $I_{RES}$ is higher than the single terminal EF I/O pull-down current capability $I_{EF}(MAX)$, raising the voltage on the single-wire bus 14 to force a latch reset.

Figure 10:
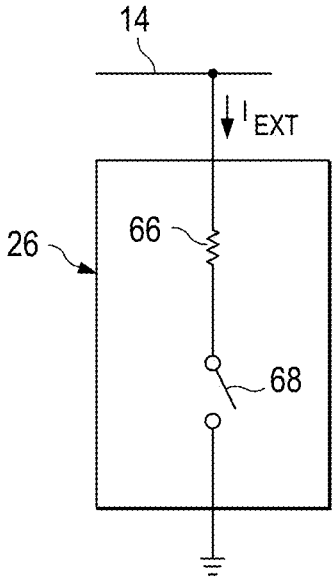
FIG. 10 is a circuit diagram corresponding to the EXT EF block 26 shown in FIG. 4.

FIG. 10 is a circuit diagram corresponding to the EXT EF block 26 shown in FIG. 4. A resistor 66 electrically connects to the single-wire bus 14. A switch 68 connects between resistor 66 and ground. Closing the switch 68 pulls current $I_{EXT}$ from the single-wire bus 14 to assert an external error flag signal.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

To illustrate, while the embodiments describe driver modules connected to a fault condition bus, any circuitry having a single terminal EF I/O can be used with the fault condition bus. The driver modules. Although the exemplary embodiments therein described a driver module that is a half-bridge inverter integrated circuit in a 3-phase motor drive configuration, the driver module may be a half-bridge inverter integrated circuit in an H-bridge configuration for a single-phase motor drive or a smart device (e.g. driver and power switch) in a single package. The system may include multiple motors that use multiple driver modules.

In some contexts, the switching of multiple switches—and the operation of the driver units that drive the switches—is coordinated to achieve a particular objective. One example of such a context is in inverters. Inverters convert a battery or other dc input into an ac signal. The ac signal can be suitable, e.g., for driving an electric motor of an electric vehicle. There are many different types of inverters and different circuit topologies and control schemes can be used. A common inverter includes three phase legs. Each phase leg includes a pair of power switches coupled in a half-bridge configuration between a high voltage rail and a low voltage rail with an intermediate output node (also called a phase output, a switch node, or an LX node) between them. The switching of the switches in the different phase legs is coordinated to generate desired waveforms on the output nodes.

Figure 11:
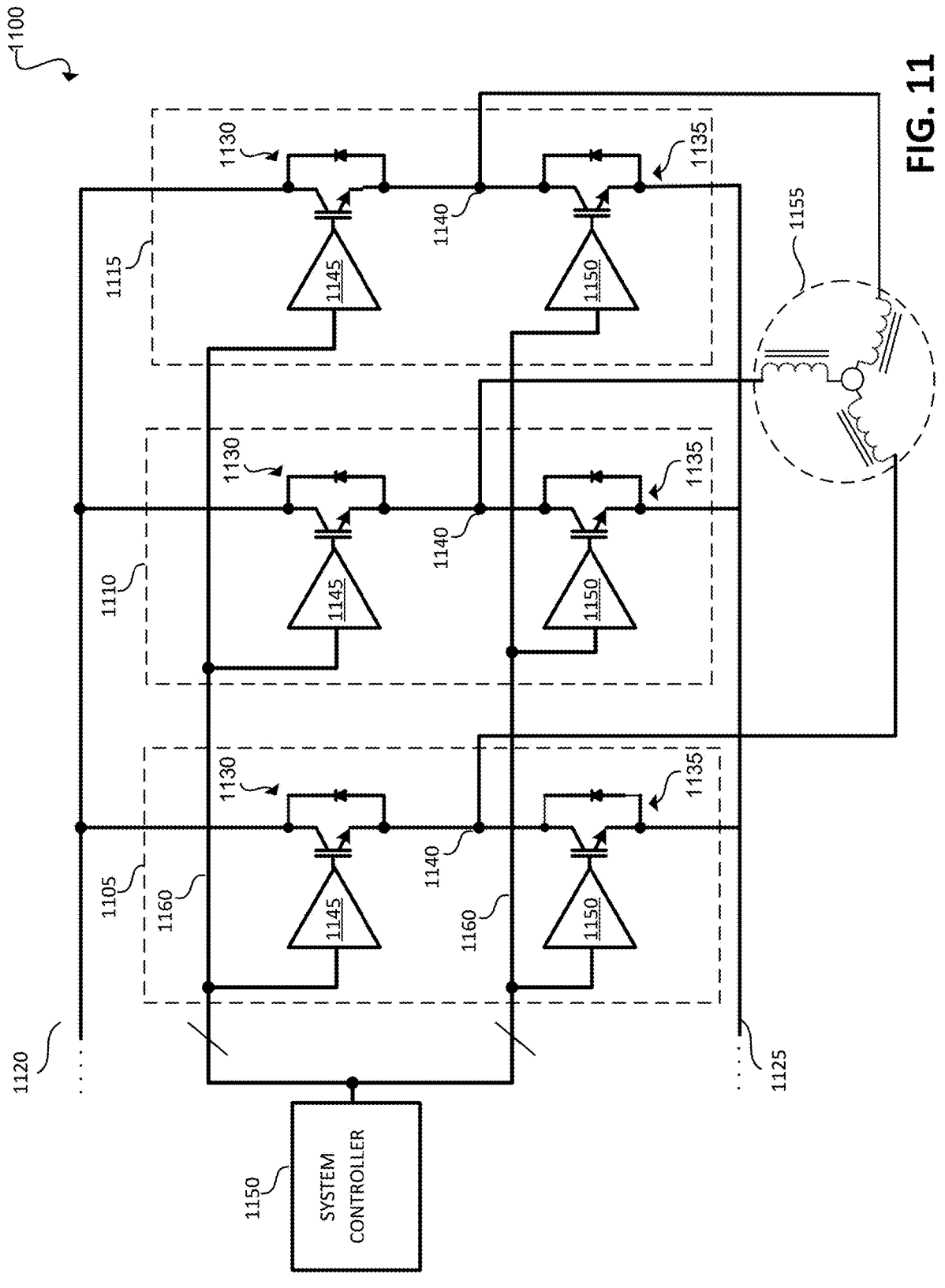
FIG. 11 is a schematic representation of an inverter that includes three phase legs.

FIG. 11 is a schematic representation of an inverter 1100 that includes three phase legs 1105, 1110, 1115 coupled between a high voltage rail 1120 and a low voltage rail 1125.

Each phase leg 1105, 1110, 1115 includes a respective high side power switch 1130, a low side power switch 1135, an output node 1140, a high side driver unit 1145, and a low side driver unit 1150. Each high side driver unit 1145 drives a respective high side power switch 1130. Each low side driver unit 1145 drives a respective low side power switch 1135.

Although power switches 1130, 1135 are illustrated as insulated gate bipolar transistors (IGBTs) and their terminals are described with corresponding (gate, emitter, collector) terminology, power switches 1130, 1135—and indeed, all of the power switches described herein—can also be implemented as metal-oxide field-effect transistors (MOSFETs) or bipolar junction transistors (BJTs). Further, the power switches can be implemented using gallium nitride (GaN), silicon (Si), or silicon carbide (SiC) semiconductors. Also, although gate driver units 1145, 1150 are drawn as triangular-shaped blocks, driver units 1145, 1150 generally include some level of both communication and control circuitry—in addition to the drive circuitry that biases the control terminal of a respective power switch 1130, 1135. In some implementations, driver units 1145, 1150 may also include fault detection circuitry to detect fault conditions of power switches 1130, 1135 (e.g., short-circuit or over-current faults).

The switching of switches 1130, 1135 in phase legs 1105, 1110, 1115 is coordinated by a system controller 1150 in accordance with a drive scheme. Due to this coordination, gate driver units 1145, 1150 form a network that achieves a desired driving of a load 1155. The particular details of the drive scheme will depend on the desired driving and load 155. In the illustrated implementation, load 1155 is illustrated as a three phase induction motor. However, load 1155 can be any of a number of different loads and a variety of different drive schemes can be used.

System controller 1150 communicates with gate driver units 1145, 1150 using gate driver bus 1160. Although only a single line is drawn in the schematic representation of inverter 1100, this single line generally represents a bus with multiple wires or other communication channels—as represented by the slanted lines across bus 1160. For example, system controller 1150 and gate driver units 1145, 1150 may coordinate the switching of switches 1130, 1135 using a separate communication channel on bus 1160 for each pair of gate driver units 1145, 1150, a pair of communication channels for each pair of gate driver units 1145, 1150, or a pair of communication channels for each individual gate driver unit 1145, 1150 (i.e., four gate driver channels per each phase leg 1105, 1110, 1115). As another example, system controller 1150 and gate driver units 1145, 1150 may communicate using one or more communication channels that convey, e.g., status and/or fault detection information-either or both from system controller 1150 to gate driver units 1145, 1150 and from gate driver units 1145, 1150 to system controller 1150. Thus, communication between system controller 1150 and gate driver units 1145, 1150 is not limited to coordination of switching.

Figure 12:
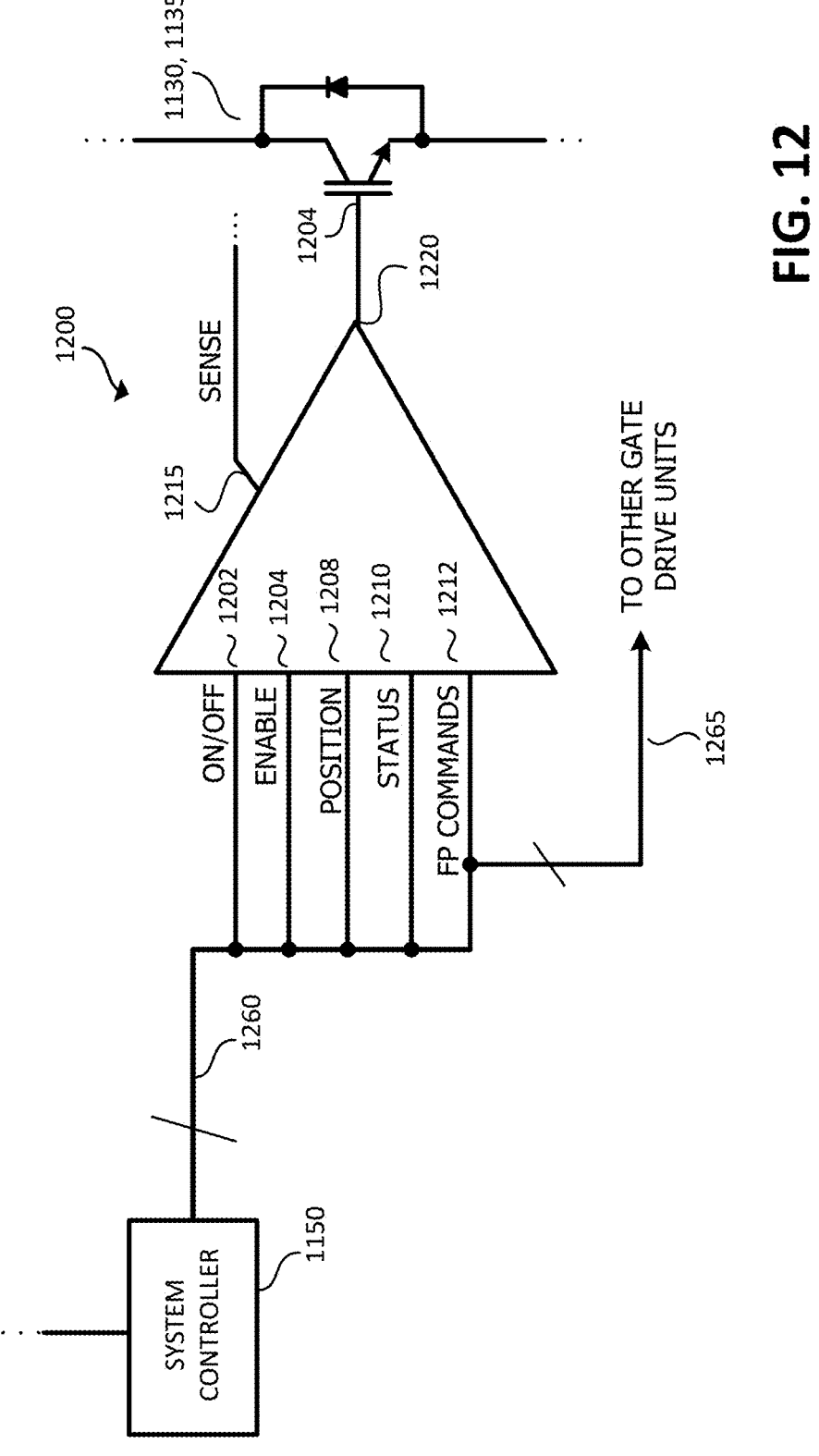
FIG. 12 is a schematic representation of an example gate driver unit.

FIG. 12 is a schematic representation of an example gate driver unit 1200. Gate driver unit 1200 can be configured to drive power switches, e.g., high and low side power switches 1130, 1135 in an inverter such as inverter 1100 (FIG. 11). However, in addition to the functionality attributed to gate driver unit 1145, 1150, gate driver unit 1200 can also communicate with other gate driver units to convey, e.g., fault protection information. At least some portion of this communication is not mediated by a system controller such as system controller 1150. Rather, one gate driver unit 1200 can convey information to another gate driver unit 1200, thus speeding communications and decreasing the time needed for one gate driver unit 1200 to respond to conditions at another gate driver unit.

In more detail, the illustrated implementation of gate driver unit 1200 includes terminals 1202, 1204, 1206, 1208, 1210, 1212, a sense input 1215, and a drive signal output 1220. Sense input 1215 is configured to input one or more signals that include information characterizing the operation of the power switch 1130, 1135 driven by gate driver unit 1200. The received information can suffice for gate driver unit 1200 to determine a fault condition in the driven power switch 1130, 1135. The information can characterize, e.g., current flow through the driven power switch, the voltage at one or more terminals of the driven power switch, and/or the temperature of the power switch. In one example, sense input 1215 may be implemented using multiple physical terminals that are each dedicated to receiving a different signal. In another example, a single terminal may be used for sense input 1215 to sense multiple characteristics of the power switch 1130,1135, such as the current flow or the voltage at one terminal of the power switch 1130, 1135. Further, multiplexing and other channel division schemes could also be used to receive different signals over a single terminal.

Drive signal output 1220 outputs the drive signal that is coupled to the gate terminal of the driven power switch 1130, 1135. The particular characteristics of the drive signal will depend on the nature of the driven power switch 1130, 1135. Further, the drive signal will generally be conditioned to achieve a certain switching profile including, e.g., switching speed, level of dv/dt withstand immunity, and the like. In some implementations, a gate resistance and/or other components are coupled between the drive signal output 1220 and the gate terminal of the driven power switch 1130, 1135.

Terminals 1202, 1204, 1206, 1208, 1210, 1212 are all configured to be coupled to wires in bus 1260 to exchange information and/or commands with system controller 1150. As discussed below, at least one of terminals 1202, 1204, 1206, 1208, 1210, 1212 can also be coupled to a bus 1265 that establishes at least one communication channel that allows different gate driver units to exchange information and/or commands with each other, i.e., without mediation by system controller 1150. Although bus 1265 is illustrated as a single wire bus, bus 1265 can also be implemented using multiple wires and/or communication channels.

The particular details about the information and/or commands communicated over terminals 1202, 1204, 1206, 1208, 1210, 1212 can vary in different implementations of different gate driver units. However, in the illustrated gate driver unit 1200, terminal 1202 can be an input terminal that is configured to receive commands that specify the times at which the power switch driven by gate driver unit 1200 is to be driven ON and OFF. The timing commands can be received from a system controller such as system controller 1150. The commands received by terminal 1202 can convey timing information in a variety of different ways. For example, a pulse train with logic high and logic low sections can convey when the power switch is to be driven ON and OFF. For example, the logic high sections can convey when the power switch is to be driven ON and the logic low sections can convey when the power switch is to be driven OFF.

Although terminal 1202 is illustrated as a single terminal that is connected to a single wire of bus 1260, terminal 1202 can also be implemented as a pair of terminals that are connected to different wires. For example, one terminal of the pair can be configured to receive commands that specify the times at which the power switch is to be driven ON by gate driver unit 1200. The other can be configured to receive commands that specify the times at which the same power switch driven is to be driven OFF by gate driver unit 1200. As another example, one terminal of the pair can be configured to receive commands that specify the times at which the power switch driven by gate driver unit 1200 is to be driven ON and OFF. The other of the pair can be configured to receive commands that specify the times at which a different gate driver unit is to drive a different power switch ON and OFF. For example, if gate driver unit 1200 is coupled to drive a high side switch, the different gate driver unit can be coupled to drive a low side switch in the same inverter phase leg. The ON/OFF timing commands for both gate driver units in a phase leg can be used by gate driver units such as gate driver unit 1200 to ensure that an inadvertent short across the phase leg is avoided.

Returning to the illustrated gate driver unit 1200, terminal 1204 can be an input terminal that is configured to receive commands that enable (essentially, "turn on") or disable (essentially, "turn off") gate driver unit 1200. The commands can be received from a system controller such as system controller 1150. In one example, if terminal 1204 is set low, the gate driver unit 1200 ignores signals received on terminal 1202 to turn ON and turn OFF the power switch. If terminal 1204 is set to high, the gate driver unit 1200 responds to signals received on terminal 1202.

Terminal 1208 can be an input terminal that is configured to receive information that characterizes the position of gate driver unit 1200 in a network of gate driver units. For example, the position information can be embodied in a signal received from a system controller such as system controller 1150. As another example, the position information can be deduced from the nature of components that are coupled to terminal 1208. For example, a pull-down or pull-up resistor may be coupled to terminal 1208 and either a return (e.g. GND) or a voltage supply (e.g. VCC) to hard-code the position of the gate driver unit 1200 in the network of gate driver units. In this case, terminal 1208 is not coupled to the system controller.

The position information received at terminal 1208 suffices to specify the role of gate driver unit 1200 in the network of gate driver units so that gate driver unit 1200 can respond appropriately in the event of a fault condition in the network. By way of example, referring back to inverter 1100 (FIG. 11), the operations of the six driver units 1145, 1150 form a network and the switching of power switches 1130, 1135 must be coordinated to perform a task, namely, driving three phase induction motor 1155. In this context, the position information can specify whether gate driver unit 1200 is positioned as a high-side gate driver unit 1145 or a low-side gate driver unit 1150. In other contexts in which the operations of gate driver units are coordinated to perform other tasks with other coordination schemes, different position information can be received.

In any case, as discussed further below, the received position information can contribute to the fault protection functionality provided by gate driver unit 1200.

Terminal 1210 can be a bidirectional input/output terminal that is configured to transmit and receive status information that characterizes the operational status of a device or system in which gate driver unit 1200 is active, as well as the operational status of gate driver unit 1200 or the power switch 1130, 1135 driven thereby. The exchange of status information is generally mediated by a system controller such as system controller 1150. For example, if gate driver unit 1200 were to transmit status information over terminal 1210, system controller 1150 could receive the status information and relay the received status information to other gate driver units using the same channel in bus 1260.

As discussed below, the status information conveyed over terminal 1210 can be used by gate driver unit to interpret fault protection commands. In some implementations, the status information can characterize the fault at a relatively high level of abstraction. For example, rather than specifying the precise nature of the fault, the gate driver unit that detects a fault can transmit status information indicating a classification of the fault. The classification can contribute to the interpretation of fault protection commands for determining an appropriate response. In some implementations, position information received over terminal 1208 can also contribute to the interpretation of fault protection commands for determining an appropriate response. In such cases, even though the other gate drive units are not provided extensive details regarding the nature of any particular fault, they can still respond appropriately based on the processing done by the transmitting gate driver unit to classify the fault.

In any case, the particular status information conveyed over terminal 1210 will depend on the operational context of gate driver unit 1200. For example, in one implementation in which gate driver unit 1200 is operating within an inverter, the status information can characterize whether a fault has been detected within the inverter.

In other implementations, the status information can provide additional details regarding the nature of the fault. For example, in the context of an inverter, the status information can identify the fault as:

an undervoltage lock-out condition is present on the primary side of a power converter that supplies the power used by gate driver unit 200 to drive power switch 130, 135, an undervoltage lock-out condition is present on the secondary side of a power converter that supplies the power used by gate driver unit 200 to drive power switch 130, 135, a phase short circuit present in the inverter, a short circuit present across the switch 130, 135, an over temperature detection of the gate driver unit 200, a watchdog time-out within the gate driver unit 200, a detection of communication failures within the gate driver unit 200, a failure of either the power switch driven by gate driver unit 200 or a power switch elsewhere in a network of power switches to turn on, or a fault indicated by an external device.

Other faults and/or information may be identified by the status information.

Terminal 1212 can be a bidirectional input/output terminal that is configured to transmit and receive fault protection commands. In the illustrated implementation, terminal 1212 is coupled both to a channel in bus 1260 and to at least one channel in bus 1265 that can convey information to corresponding terminals on other gate drive units. Bus 1260 and the channel in bus 1265 can be physically implemented in a variety of different ways. For example, buses 1260, 1265 can be formed using multiple insulated wires housed in a single insulating sheath. As another example, buses 1260, 1265 can be formed using separate insulated wires that are loose or tied together, e.g., using a cable tie. As another example, buses 1260, 1265 can be formed by multiplexing or otherwise dividing wires into multiple communication channels.

In any case, gate driver units can communicate with one another over bus 1265 without mediation by system controller 1150.

The fault protection commands on buses 1260, 1265 can originate from individual gate driver units in a network— including gate driver unit 1200. In some implementations, the fault protection commands may also originate from system controller 1150. However, when the gate driver units can communicate with one another without mediation by system controller 1150, the network of gate driver units can respond to fault conditions relatively more quickly. The fault protection functionality that is present in the individual gate driver units for monitoring the operation of the power switch that it drives can be leveraged. Indeed, in the event that system controller 1150 itself suffers a fault, a more serious failure can be avoided.

As discussed above, proper interpretation of the fault protection commands received over terminal 1212 can be based on other information and/or commands received by gate driver unit 1200. For example, the fault protection commands received over terminal 1212 can be expressed at a relatively high level of abstraction, e.g., using logic high/logic low states.

In the example below, the commands expressed in the logic high/logic low states correspond to the location of the fault within an inverter, e.g., whether the fault has occurred on the high side or the low side. In such cases, the proper response of a gate driver unit is determined based on other, related information. For example, the proper response of a gate driver unit to these states can depend on the position of the gate driver in an inverter—as indicated by the position information received at terminal 1208. As yet another example, the proper response of a gate driver unit to the fault protection commands received over terminal 1212 can depend on whether a fault is present or even specific characteristics of the fault—as indicated by the status information conveyed over terminal 1210.

Figure 13:
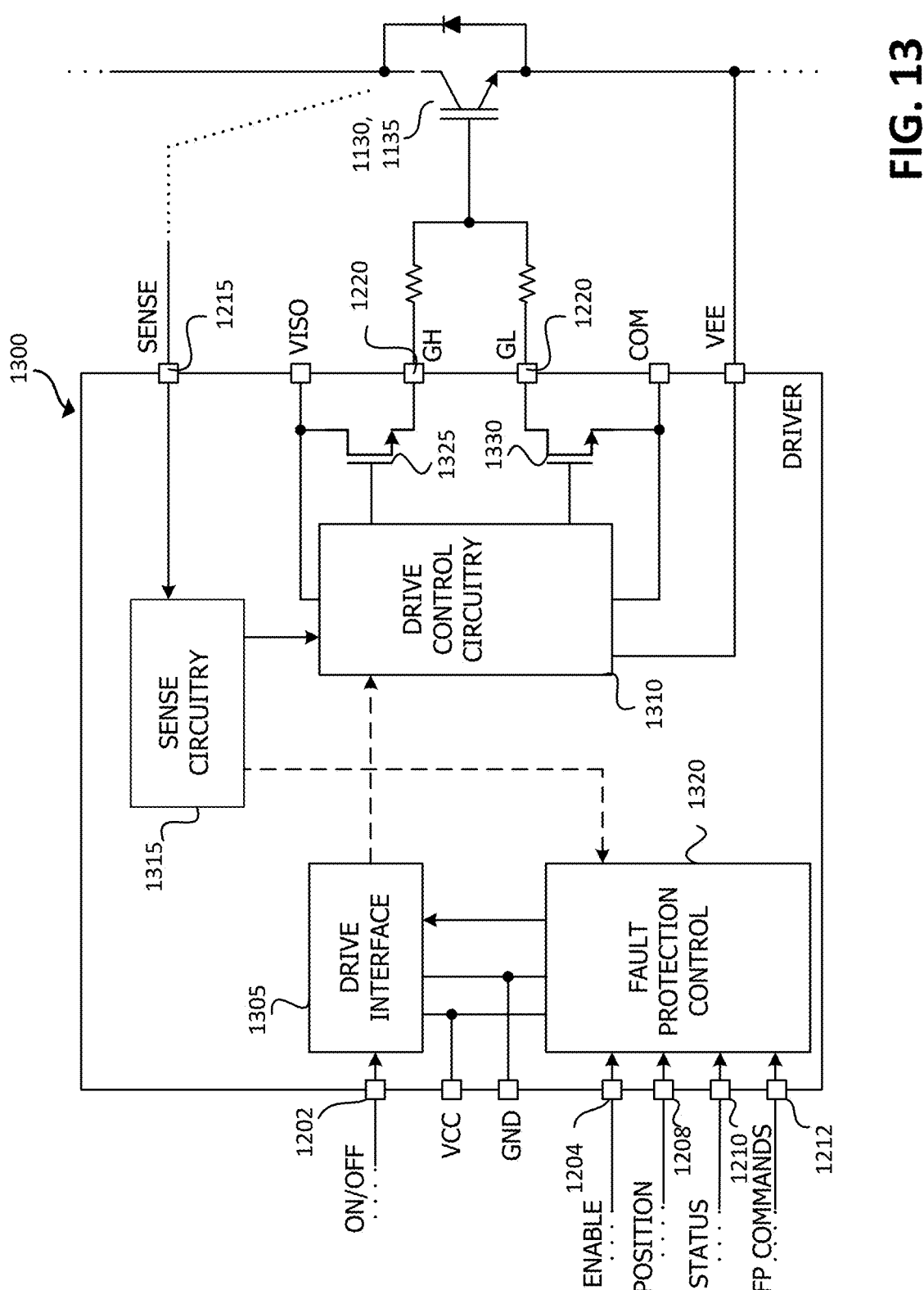
FIG. 13 is a schematic representation of an implementation of a gate driver unit.

FIG. 13 is a schematic representation of an implementation of a gate driver unit 1300. Gate driver unit 1300 is one possible implementation of gate driver unit 1200 (FIG. 12) and features that are shared have been denoted with the same reference numerals.

Gate driver unit 1300 includes a drive interface 1305, drive control circuitry 1310, sense circuitry 1315, and a fault protection control 1320. Drive interface 1305 is a communications interface that converts the timing commands received at terminal 1202 into commands that are appropriate for drive control circuitry 1310. In general, drive interface 1305 is galvanically isolated from drive control circuitry 1310. Circuitry coupled to the primary-side of the galvanic isolation receive operating power from terminals VCC and GND. Circuitry coupled to the secondary-side of the galvanic isolation receive operating power from terminals VISO and COM. The dashed line between the drive interface 1305 and drive control circuitry 1310 indicates the galvanic isolation and that information can be communicated—even across galvanic isolation. For example, drive interface 1305 may transmit timing commands to drive control circuitry 1310 using, e.g., optical components, a communications transformer, magnetically-coupled indictors, capacitively-coupled components, or the like. The details of the conversion performed by drive interface 1305 can depend upon, e.g., the nature of the drive control circuitry 1310, the signals received at terminal 1202, and whether and how drive interface 1305 is galvanically isolated from drive control circuitry 1310.

The conversion performed by drive interface 1305 is also based on input from fault protection control 1320. As discussed further below, fault protection control 1320 may recognize and categorize a short circuit fault in the power switch driven by gate driver unit 1300 or be informed about a short circuit fault in another power switch driven that is driven by a different gate driver unit. Fault protection control 1320 is configured to instruct drive interface 1305 (or, in some implementations, drive control circuitry 1310) to tailor the driving of power switch 1130, 1135 based on such faults. For example, fault protection control 1320 may be configured to instruct drive interface 1305 or drive control circuitry 1310 to hold power switch 1130, 1135 open or closed—regardless of the timing commands received at terminal 1202.

Drive control circuitry 1310 is responsible for generating a drive signal for the power switch 1130, 1135 driven by gate driver unit 1300. Drive control circuitry 1310 generates the drive signal in accordance with the commands received from drive interface 1305 and any tailoring received from fault protection control 1320. For example, in the illustrated implementation, drive control circuitry 1310 biases a pull-up transistor 1325 and a pull-down transistor 1330 to couple and decouple appropriate voltages with the control terminal of the driven power switch 1130, 1135. In some implementations, the drive signal for the driven power switch 1130, 1135 can be shaped, e.g., to achieve a specific turn-on profile, to avoid harm to the driven power switch 1130, 1135, to respond to operational conditions, or to achieve other objectives. For example, the drive signal for the driven power switch 1130, 1135 can be controlled based on measured values or a feedback signal received from sense circuitry 1315.

Sense circuitry 1315 is coupled to the driven power switch 1130, 1135 and configured to sense one or more parameters that characterize the state of the driven switch. At least some of the sensed parameters are appropriate for identifying one or more fault conditions in the switching of the switch. Measured values or other information about the parameters is communicated to fault protection control 1320. In general, sense circuitry 1315 is galvanically isolated from fault protection control 1320 and the dashed line between the sense circuitry 1315 and fault protection control 1320 indicates that information can be communicated—even across galvanic isolation. In some implementations, sense circuitry 1315 communicates information about the sensed parameters of the drive switch 1130, 1134 to the drive interface 1305 using the same galvanically-isolated communication channel(s) used to transmit timing commands from drive interface 1305 to drive control circuitry 1310. Drive interface 1305 may then send the sensed parameters to the fault protection control 1320.

As for the sensed parameter(s), sense circuitry 1315 can be configured to sense the main current through power switch 1130, 1135, one or more voltages at a node of power switch 1130, 1135, or both the current and voltage(s). In some implementations, sense circuitry 1315 may also sense the temperature of power switch 1130, 1135. For example, a short circuit or failure to turn on can be identified from either the magnitude and/or the waveform of the main current through the driven power switch. As another example, a short circuit or failure to turn on can be identified from the voltage drop across the main terminals of the driven power switch. As discussed above, in some implementations, sense circuitry 1315 can provide measured values or a feedback signal to drive control circuitry 1310.

Fault protection control 1320 is circuitry that is configured to implement fault protection functionality within gate driver unit 1300. Fault protection functionality is a group of operations performed by the gate driver unit 1300 to recognize and respond to fault conditions. The fault conditions can be present in gate driver unit 1300 or in another gate driver unit in a network of gate driver units. The fault condition can be present in the power switch driven by gate driver unit 1300 or in another power switch that is driven by another gate driver unit in a network of gate driver units. In some instances, the fault condition can be present in both a gate driver unit and a power switch.

Fault protection functionality typically enables each gate driver unit to monitor the operation of the power switch that it drives to recognize and characterize short circuits. For example, gate driver unit 1300 may compare the voltage across power switch 1130, 1135 and/or the current that flows between the main terminals of power switch 1130, 1135 with each other and/or with threshold levels or waveforms to recognize a short circuit condition or if power switch 1130, 1135 does not turn on. As another example, gate driver unit 1300 may monitor the temperature of the driven power switch.

Further, fault protection functionality enables each gate driver unit to:

transmit information regarding faults in the driving of a respective driven power switch, and appropriately respond to information received from other gate driver units regarding faults in the driving of the power switches that they drive. The information can be exchanged between gate driver units without mediation, e.g., by a system controller 1150 (FIG. 11). Rather, information and/or commands can be exchanged between the gate driver units themselves.

Fault protection control 1320 is coupled to terminal 1204 to receive enable/disable commands, terminal 1206 to receive reset commands, terminal 1208 to receive position information, terminal 1210 to transmit and receive status information, and terminal 1212 to transmit and receive fault protection commands. As discussed above, terminal 212 is coupled to both buses 260, 265 and fault protection commands can be exchanged on bus 1265 between gate driver units—including gate driver unit 1300—without mediation by system controller 1150.

The fault protection functionality implemented by fault protection circuit control 1320 can depend on the operational context of gate driver unit 1300. An example operational context is in an inverter, e.g., inverter 1100 (FIG. 11). In such a context, the fault protection functionality can cause gate driver unit 1300 to respond differently in the event of a low-side short circuit or a high-side short circuit. Examples of fault types and the response implemented by fault protection circuit functionality in an inverter are shown in Table 1. In Table 1, "UVLO" denotes an undervoltage lockout condition on either the primary or the secondary side of a power converter that provides the power for driving a power switch. In the context of gate driver unit 1300 (FIG. 13), an undervoltage lockout condition occurs on the secondary side when the voltage across the terminals labeled "VISO" and "COM" falls below a threshold. An undervoltage lockout condition occurs on the primary side when the voltage across the terminals labeled "VCC" and "GND" falls below a threshold.

TABLE 1

Example fault types and responses.

| | | FAULT PROTECTION CIRCUIT RESPONSE | |
|---|---|---|---|
| | | HIGH SIDE | LOW SIDE |
| FAULT | | | |
| TYPE | POSITION | SWITCHES | SWITCHES |
| Primary UVLO | High Side | ALL OFF | ALL ON |
| Primary UVLO | Low Side | ALL ON | ALL OFF |
| Secondary UVLO | High Side | ALL OFF | ALL ON |
| Secondary UVLO | Low Side | ALL ON | ALL OFF |
| Phase Short | High Side | ALL OFF | ALL ON |
| Phase Short | Low Side | ALL ON | ALL OFF |
| Failure to Switch | High Side | ALL OFF | ALL ON |
| Failure to Switch | Low Side | ALL ON | ALL OFF |
| Collector-Emitter Short | High Side | | Phase Short detected by related Low Side Switch |
| Collector-Emitter Short | Low Side | | Phase Short detected by related High Side Switch |

The commands and/or information regarding the type and location of faults that are exchanged between gate driver units on bus 1265 can be encoded using a variety of different schemes. Encoding schemes that use binary states (e.g., logic high/logic low) can be relatively robust in operational contexts where relatively large voltages are switched including, e.g., inverters.

In some implementations, commands that enable and disable a gate driver unit can be encoded as logic high/logic low states. Position information specifying that a gate driver unit is positioned on the high-side or low side can be encoded as logic high/logic low states. Status information specifying that a fault has been detected or has not been detected somewhere in the device in which gate driver unit is operating can be encoded as logic high/logic low states. Fault protection circuit commands specifying that the detected fault is on the high side of an inverter or on the low side of an inverter can be encoded as logic high/logic low states.

Table 2 and Table 3 present example implementations of fault protection circuit functionality using a binary encoding scheme. The binary information (yes/no, low/high, fault/no fault) can be encoded using logic high/logic low states in any desired manner. Table 2 describes an implementation of fault protection circuit functionality in a high-side gate driver unit, whereas Table 3 describes a corresponding implementation in a low-side gate driver unit.

TABLE 2

Fault protection functionality for a high-side gate driver unit.

| ENABLE | STATUS | POSITION | FP COMMAND | RESPONSE |
|---|---|---|---|---|
| NO | XX | HIGH | XX | OFF |
| YES | NO FAULT | HIGH | XX | DRIVING |
| YES | FAULT | HIGH | LOW | OFF |
| YES | FAULT | HIGH | HIGH | ON |

TABLE 3

Fault protection functionality for a low-side gate driver unit.

| ENABLE | STATUS | POSITION | FP COMMAND | RESPONSE |
|---|---|---|---|---|
| NO | XX | LOW | XX | OFF |
| YES | NO FAULT | LOW | XX | DRIVING |
| YES | FAULT | LOW | LOW | ON |
| YES | FAULT | LOW | HIGH | OFF |

As shown, in the example implementations of Table 2 and Table 3, the type and location of detected faults (e.g., UVLO, phase short, failure to switch, collector-to-emitter short) have been abstracted and classified into two categories, namely, whether the fault is on the high side of an inverter or on the low side. The fault protection circuit commands encode this classification as logic high or logic low. The proper response of a gate drive unit to the commands depends on the position of the gate drive unit in the inverter.

Figure 14:
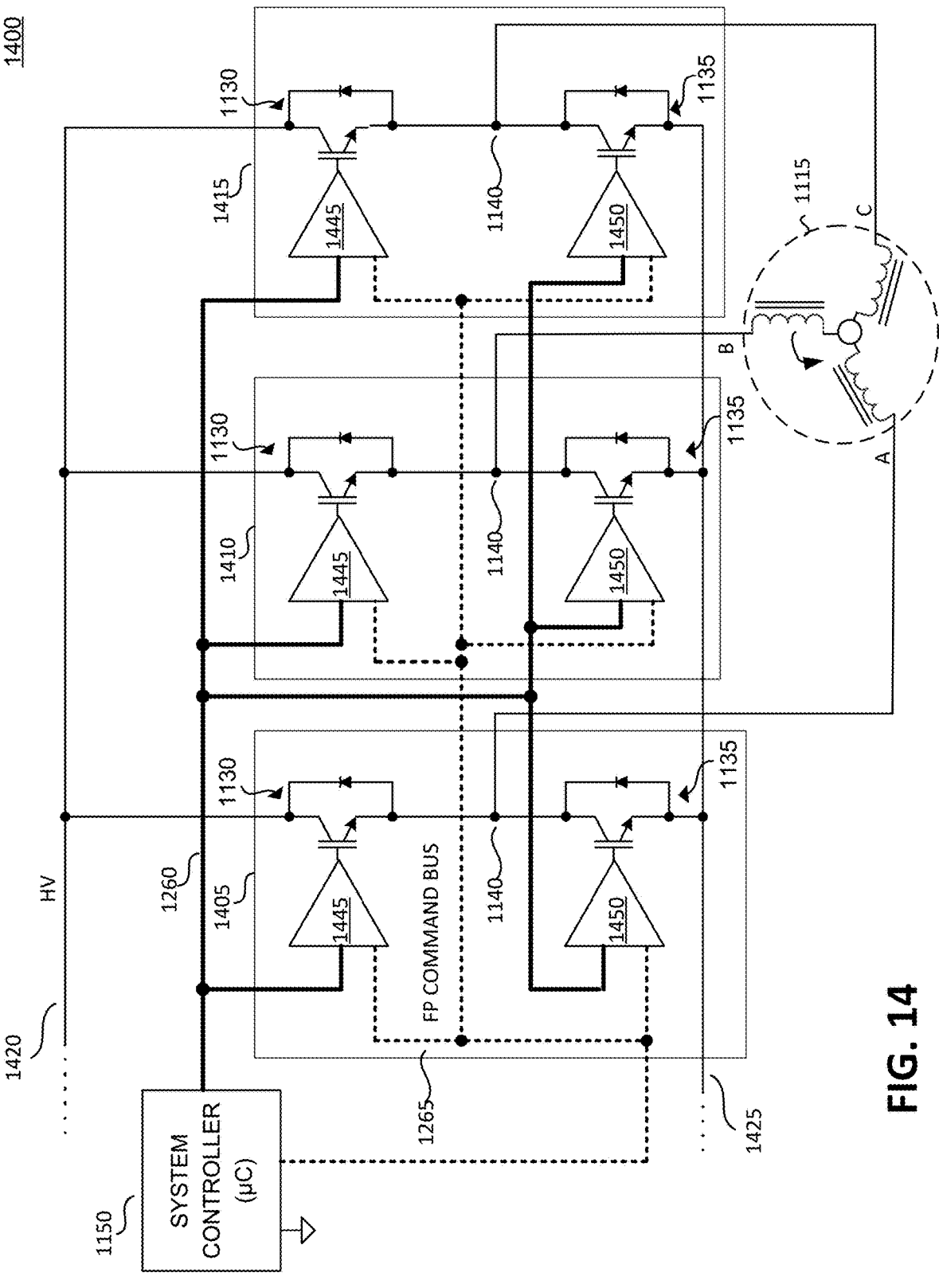
FIG. 14 is a schematic representation of an inverter that includes three phase legs.

FIG. 14 is a schematic representation of an inverter 1400 that includes three phase legs 1405, 1410, 1415 coupled between a high voltage rail 1420 and a low voltage rail 1425. Each phase leg 1405, 1410, 1415 includes a respective high side power switch 1130, a low side power switch 1135, an output node 1140, high side gate driver unit 1445, and low side gate driver unit 1450. These gate driver units 1445, 1450 are each implemented as gate driver units 1200, 1300 (FIGS. 12, 13). The high and low side gate driver units 1445, 1450 can communicate fault protection information with each other without mediation by system controller 1150. This speeds communications and decreases the time needed for one gate driver unit 1445, 1450 to respond to conditions at another gate driver unit.

Each gate driver unit 1445, 1450 includes terminal 1212 that is configured to transmit and receive fault protection commands over bus 1265 (shown in dashed lines). Bus 1265 is illustrated separately from bus 1260 to emphasize that communications over bus 1265 are not mediated by system controller 1150. Rather, a fault protection command that is transmitted over bus 1265 by one gate driver unit 1200 can be received, interpreted, and acted upon by other gate driver units 1200. As discussed below, fault protection commands can be communicated to the system controller 1150 through bus 1265, thereby keeping the system controller 1150 appraised of the fault protection commands being sent by gate drivers 1445, 1450.

In the illustrated implementation, bus 1265 is shown as a single wire that is physically separate from the other wires in bus 1260. Further, system controller 1150 is shown coupled to bus 1265 separately from the coupling to bus 1260. This is not necessarily the case. As discussed above, buses 1260, 1265 can be physically implemented in a variety of different ways and using division schemes, if needed. For example, the wires of bus 1265 can be housed separately or in the same sheath as the wires of bus 1260. Regardless of the physical implementation, information can be conveyed between gate driver units 1200 without mediation by system controller 1150.

Further, in general, system controller 1150 can also communicate on bus 1265. For example, system controller 1150 can also include a bidirectional input/output terminal that is configured to transmit and receive fault protection commands. In such implementations, system controller 1150 can communicate, e.g., fault protection commands that are received from external devices, for example, from other system controllers. In some case, primary and second UVLO commands may also be put on bus 1265 by system controller 1150.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A driver unit suitable for driving a transistor, the driver unit comprising:

a communications interface configured to receive timing information from a system controller indicating when the transistor driven by the driver unit is to be switched;

sense circuitry configured to sense one or more characteristics of a state of the transistor driven by the driver unit; and fault protection control circuitry coupled to the sense circuitry and, based on the one or more characteristics of the state of the driven transistor, configured to categorize a fault in a driving of the driven transistor, wherein the fault protection control circuitry is coupled to output a categorization of the fault from the driver unit and wherein the fault protection control circuitry is further configured to interpret and respond to corresponding categorizations of faults in driving of other transistors by other driver units without mediation by the system controller.

2. The driver unit of claim 1, wherein the fault protection control circuitry is coupled to output the categorization of the fault from the driver unit via a terminal and to receive the corresponding categorizations via the same terminal.

3. The driver unit of claim 1, wherein the driver unit includes a first terminal and a second terminal both coupled to the system controller, wherein the first terminal is configured to receive the timing information and the second terminal is configured to receive position information that characterizes a position of the driver unit in a network of driver units, and wherein the timing of the driving of transistors by the driver units in the network is coordinated by the system controller.

4. A driver module comprising:

a first switch and a second switch;

a control block configured to control the first switch and the second switch; and an error flag interface block coupled to the control block and comprising a single terminal error flag input/output (EF I/O);

wherein the error flag interface block is configured to detect an external fault condition to the driver module indicated by an error flag state on the single terminal EF I/O, wherein the external fault condition is detected outside the driver module, wherein the control block is coupled to inhibit the switching of the first switch and the second switch in response to the detection of the external fault condition, and wherein the error flag interface block is configured to set the error flag state on the single terminal EF I/O responsive to the detection of a local fault condition in the driver module by the control block.

5. The driver module of claim 4, wherein the local fault condition is selected from the group consisting of over-current, over-voltage, and over-temperature.

6. The driver module of claim 4, wherein the error flag interface block is coupled to respond to a reset state on the single terminal EF I/O and coupled to the control block to allow the switching of the first switch and the second switch.

7. The driver module of claim 4, wherein the driver module is a half-bridge inverter.

8. The driver module of claim 4, wherein the first switch, the second switch, the control block and the error flag interface block are in a single package.

* * * * *